(12) United States Patent
Shimizu et al.

(10) Patent No.: US 6,455,381 B1
(45) Date of Patent: Sep. 24, 2002

(54) METHOD OF MANUFACTURING A SEMICONDUCTOR DEVICE HAVING A TRENCH ISOLATION STRUCTURE

(75) Inventors: Masahiro Shimizu; Yoshitaka Fujiishi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,700

(22) Filed: Nov. 16, 1999

(30) Foreign Application Priority Data

May 27, 1999 (JP) ............................. 11-148864

(51) Int. Cl.[7] ............................................. H01L 21/336
(52) U.S. Cl. ...................... 438/296; 438/359; 438/424
(58) Field of Search .............................. 438/296, 359, 438/424

(56) References Cited

U.S. PATENT DOCUMENTS

| 5,093,277 A |   | 3/1992  | Arima et al. ............... 438/448 |
| 5,391,503 A | * | 2/1995  | Miwa et al. ................ 438/349 |
| 5,597,756 A |   | 1/1997  | Fazan et al. ................ 438/398 |
| 5,950,090 A | * | 9/1999  | Chen et al. ................. 438/296 |
| 6,001,706 A | * | 12/1999 | Tan et al. ................... 438/424 |
| 6,251,746 B1 | * | 6/2001 | Hong et al. ................. 438/424 |
| 6,258,692 B1 | * | 7/2001 | Chu et al. .................. 438/400 |
| 6,277,710 B1 | * | 8/2001 | Kim et al. .................. 438/424 |

FOREIGN PATENT DOCUMENTS

| JP | 40732660 A | * | 12/1995 |
| JP | 10-50697 |   | 2/1998 |
| JP | 10-189706 |   | 7/1998 |

OTHER PUBLICATIONS

Wolf et al., Silicon Procesing For The VLSI Era, vol. 1, Lattice Press, 1986, pp. 57–61 and 531–534.*
Ghandhi, VLSI Fabrication Principles, Wiley & Sons, 1983, pp. 353–355.*

* cited by examiner

Primary Examiner—John F. Niebling
Assistant Examiner—Lynne A. Gurley
(74) Attorney, Agent, or Firm—McDermott, Will & Emery

(57) ABSTRACT

A method of manufacturing a semiconductor devices includes the formation of a pad insulating film, a polysilicon film and a silicon nitride film on a semiconductor substrate. A trench portion is formed in the substrate after etching, and silicon oxide is embedded in the trench portion. The silicon nitride film, polysilicon film, and pad insulating film are then removed to expose a surface of the semiconductor substrate. The removal of the polysilicon film is by isotropic wet etching. A circuit element is formed on the exposed surfaces of the semiconductor substrate.

10 Claims, 10 Drawing Sheets

DEVICE PORTION     MARK PORTION

DEVICE PORTION        MARK PORTION

METHOD OF MANUFACTURING A SEMICONDUCTOR DEVICE HAVING A TRENCH ISOLATION STRUCTURE

BACKGROUND OF THE INVENTION

1. Field of the Invention

The present invention relates to improvement of a manufacturing method of a semiconductor device having a miniature structure with trench isolation.

2. Background Art

In recent years, the demand for semiconductor devices has increased rapidly with marked spread of information equipment such as computers or the like. In terms of functionality, semiconductor devices having large memory capacity and capable of high-speed operation are required. To satisfy those demand and requirements, technical developments for increasing the integration density, the response speed, and the reliability of semiconductor devices are now being made.

The trench isolation as a device isolation method in semiconductor devices is effective for the device miniaturization because what is called bird's beak is less prone to be formed in the trench isolation than in the LOCOS isolation. A manufacturing method including trench isolation will be described below.

As shown in FIG. 17, patterns of a pad insulating film 2 (silicon oxide film), a polysilicon film 3, and a silicon nitride film 4 are formed on a p-type silicon substrate 1.

Then, as shown in FIG. 18, a trench 5 is formed by etching the silicon substrate 1 by using the silicon nitride film 4 as a mask. Alternatively, the silicon nitride film 4, the polysilicon film 3, the pad insulating film 2, and the silicon substrate 1 may be etched at one time by using a resist mask.

Then, as shown in FIG. 19, after the trench 5 is filled in by depositing a silicon oxide film 6 by CVD, for example, the part of the silicon oxide film 6 above the silicon nitride film 4 is removed by CMP, for example. Part of the remaining silicon oxide film 6 is thereafter removed by using hydrofluoric acid, whereby the level difference is reduced.

Then, as shown in FIG. 20, the silicon nitride film 4 is removed by using phosphoric acid, for example.

Then, the polysilicon film 3 shown in FIG. 20 is removed by using a plasma etching apparatus, whereby the pad insulating film 2 is exposed as shown in FIG. 21.

Then, the pad insulating film 2 shown in FIG. 21 is removed by using hydrofluoric acid, whereby the surface of the silicon substrate 1 is exposed as shown in FIG. 22.

Then, as shown in FIG. 23, a gate insulating film 7 is formed, and a doped polysilicon film 8, a metal silicide film 9, and an insulating film 10 are formed thereon. Thereafter, a gate electrode is formed by patterning and etching the lamination films. A MOS transistor is thereafter formed by forming a pair of n-type source and drain regions 11 by ion implantation.

In the above manufacturing process, the thickness of the pad insulating film 2 has been reduced with the recent miniaturization of devices. As a result, the etching damage that occurs in removing the polysilicon film 3 on the pad insulating film 2 tends to encompass the silicon substrate 1.

Where the trench-filling silicon oxide film 6 is formed by HDP-CVD, it has an overhang as shown in part A in FIG. 24. This causes another problem that polysilicon etching residues 12 tend to occur as shown in FIG. 25 when the polysilicon film 3 is etched.

Because of a small selective etching ratio of the polysilicon film 3 to the pad insulating film 2, the thickness of the remaining pad insulating film 2 varies in its plane. Therefore, where an impurity for controlling the threshold voltage of the transistor is implanted in the state of FIG. 21, a problem occurs that the uniformity of the threshold voltage is low. This phenomenon is remarkable when the implantation energy is low.

Where the trench-filling silicon oxide film 6 is formed by HDP-CVD, for example, there is a problem that at the time of a heat treatment the thickness of the pad insulating film 2 is increased as denoted by reference numeral 19 in FIG. 26 because of degassing from the silicon oxide film 6 (HDP-CVD film). This phenomenon is particularly remarkable in a wafer peripheral portion, and causes a problem that the uniformity of the threshold voltage is low in a case where an impurity for threshold voltage control is implanted.

There is another problem that if the above-mentioned heat treatment is performed in a nitriding atmosphere, the silicon substrate 1 is nitrided through the pad insulating film 2. In particular, this phenomenon occurs in a case where the pad insulating film 2 has thin portions in the vicinity of the isolation oxide film 6 as shown in part B in FIG. 27. And this phenomenon is particularly remarkable in a case where the pad insulating film 6 is formed again (a process of FIG. 21→FIG. 22→FIG. 21). In nitrided regions, the thickness of the gate oxide film 7 is small and hence the gate breakdown voltage is low; that is, the reliability of the gate insulating film 7 is lowered.

FIGS. 28–31 show another problem of roughening of the trench portion. In each of FIGS. 28–31, the left-hand part shows a device portion (or a device forming portion) and the right-hand part shows a mark portion.

The conventional trench isolation has a problem that, because of a small level difference, alignment marks cannot be detected at ensuing steps. To solve this problem, after formation of the trench isolation structure, the portions other than mark portions are covered with a resist 21 (see FIG. 28) and then the silicon oxide film 6 that is buried in the trench portion 22 is removed only in the mark portions to form steps (see FIG. 29). Then, an impurity for well formation or control of the threshold voltage of the transistor is implanted (see FIG. 30). However, there is a problem that the portions where the silicon substrate 1 is exposed, in particular, the trench portions, are roughened in a heat treatment for activating the impurity (see FIG. 31). The roughening may lower the alignment accuracy. It is considered that this phenomenon relates to the etching damage or stress that occurs at the time of the formation of the trench isolation structure. This phenomenon is particularly remarkable in a case where the trench isolation structure is formed in a high-temperature, non-oxidizing atmosphere.

SUMMARY OF THE INVENTION

The present invention has been made to solve the above problems in the art, and an object of the invention is therefore to increase the reliability of a gate oxide film and improve the junction leak characteristic by wet-removing a silicon film on an insulating film or optimizing treatment/film-forming steps in a trench isolation process.

According to one aspect of the present invention, in a method of manufacturing a semiconductor device, a pad insulating film, a polysilicon film, and a silicon nitride film are formed sequentially on a semiconductor substrate. A trench portion for isolating device forming regions on the semiconductor substrate is formed by selectively etching the silicon nitride film, the polysilicon film, the pad insulating film, and the semiconductor substrate. A silicon oxide film is embedded in the trench portion for isolating the device forming regions. The silicon nitride film, the polysilicon film, and the pad insulating film are removed to expose a surface of the semiconductor substrate. Then, a circuit element is formed on the exposed surface of the semiconductor substrate. Particularly in the above method, the polysilicon film is removed by isotropic wet etching.

According to another aspect of the present invention, in a method of manufacturing a semiconductor device, at least a gate insulating film, a polysilicon film, and an upper insulating film are sequentially formed on the exposed surface of the semiconductor substrate as described above, and a gate electrode is formed by patterning the upper insulating film, the polysilicon film, and the gate insulating film by anisotropic etching. Then, isotropic wet etching is performed to remove polysilicon on the surface of the semiconductor substrate.

According to still another aspect of the present invention, in a method of manufacturing a semiconductor device, a storage node is formed on an interlayer insulating film that is formed on a semiconductor substrate. The surface of the storage node is roughened. Then, wet-etching is performed on the surface of the interlayer insulating film.

Other and further objects, features and advantages of the invention will appear more fully from the following description.

DETAILED DESCRIPTION OF THE PREFERRED EMBODIMENTS

Figure 1:
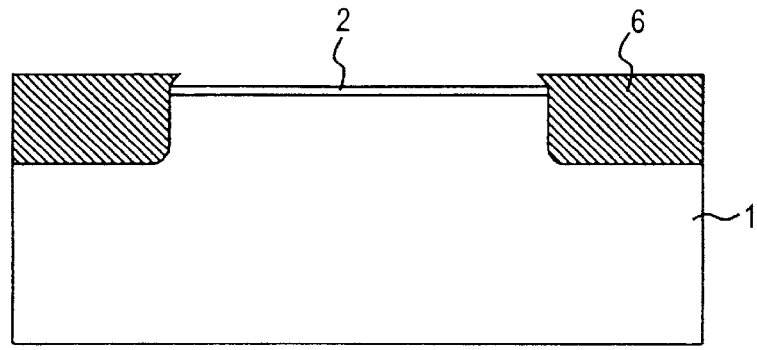
FIG. 1 is a cross sectional view of a semiconductor device to explain a first embodiment of the present invention.

Some preferred embodiments of the present invention will be hereinafter described with reference to the accompanying drawings. The parts in the drawings that are the same as or corresponding to each other are given the same reference numerals and their descriptions will be simplified or omitted.

EMBODIMENT 1

A first embodiment of the invention will be described by using FIGS. 17–23 in a diverted manner. This embodiment relates to improvement of the conventional trench isolation process.

In the manufacturing method according to this embodiment including trench isolation, first, the conventional steps of FIGS. 17–20 are executed.

Figure 20:
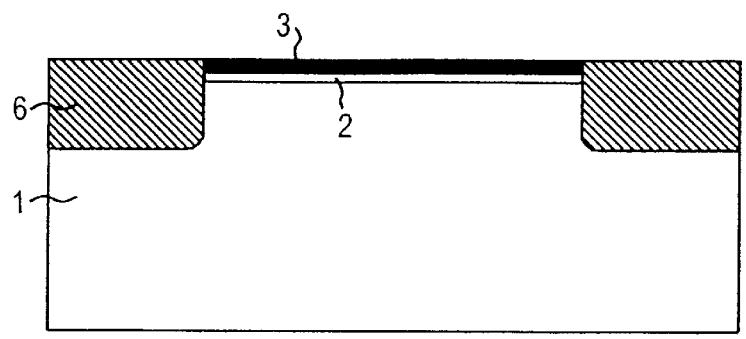
Figure 21:
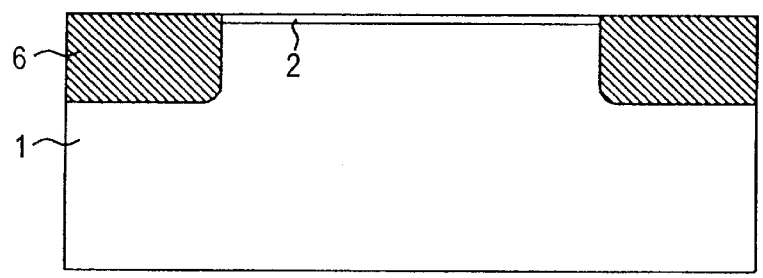

In the conventional step that causes the transition from FIG. 20 to FIG. 21, the polysilicon film 3 is subjected to plasma etching. In contrast, in this embodiment, the polysilicon film 3 is removed by wet etching.

Where the polysilicon film 3 is removed by wet etching, the silicon substrate 1 is not damaged. Therefore, this measure provides an advantage that the reliability of the gate insulating film 7 to be formed on this surface is increased and the junction leak current in the source and drain regions is decreased.

Figure 24:
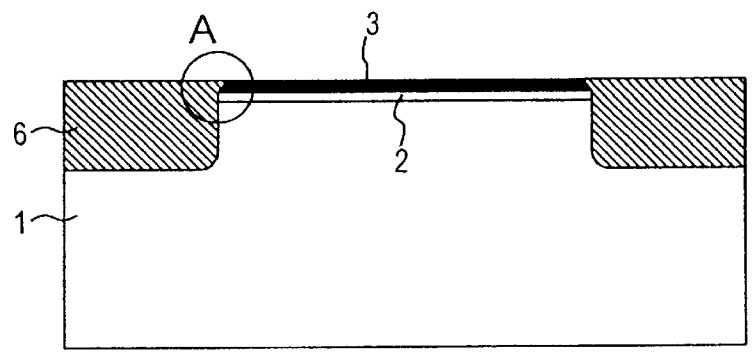
FIGS. 24 through 27 are cross sectional views respectively for explaining a manufacturing method of a semiconductor device in a conventional art.
Figure 25:
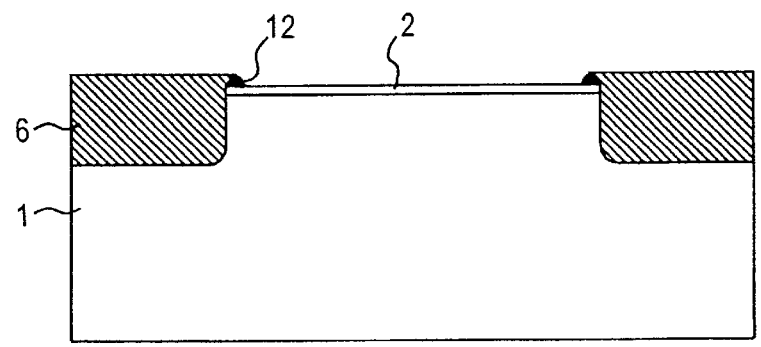

At the stage of FIG. 20, the trench isolation structure may be such that the trench oxide film 6 is buried so as to form an overhang as shown in part A in FIG. 24. Even where the trench isolation structure has such a shape, if the polysilicon film 3 is removed by wet etching which is isotropic, no etching residue of the polysilicon film 3 remains as shown in FIG. 1, to provide advantages that, for example, the rate of occurrence of short-circuiting between gate lines is reduced and the rate occurrence of defects due to peeling-off of polysilicon residues.

Figure 22:
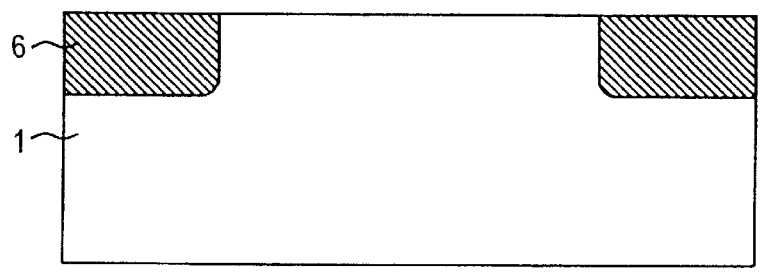

The steps of FIG. 22 and the following figures may be the same as in the conventional process and hence the explanation will not be repeated here.

Figure 30:
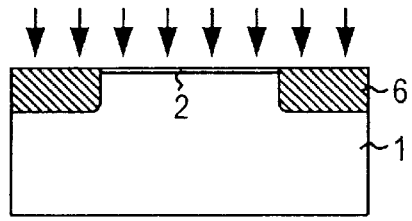
Figure 30:
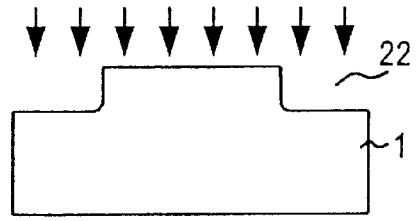

By using, as a wet etching liquid, aqueous ammonia or a mixed liquid of aqueous ammonia and a hydrogen peroxide solution, a large selective etching ratio to the pad insulating film 2 can be obtained and hence the uniformity of the thickness of the remaining pad insulating film 2 is improved. Therefore, for example, when an impurity for threshold voltage control is implanted through the pad insulating film 2 (see FIG. 30), the uniformity of the threshold voltage in the wafer surface can be improved. Although the above description is directed to the trench isolation, equivalent advantages can be obtained also for the polysilicon buffer LOCOS isolation.

As described above, according to this embodiment, the polysilicon film on the pad insulating film that is formed on the substrate is wet-removed after formation of the trench isolation structure. This makes it possible to, for example, increase the reliability of the gate oxide film, reduce the junction leak current, decrease polysilicon etching residues, and increase the uniformity of the threshold voltage.

Figure 17:
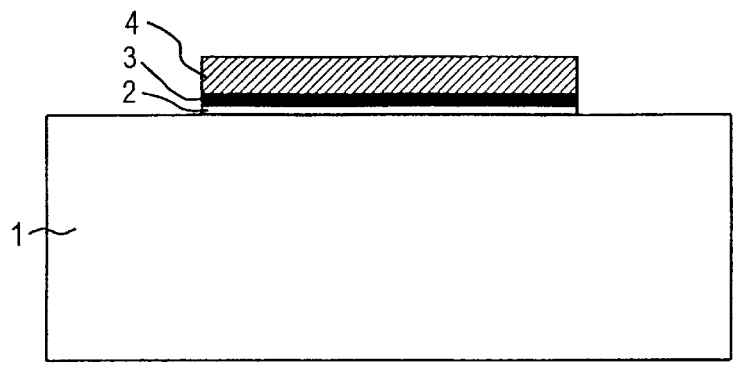
FIGS. 17 through 23 are cross sectional views for explaining a process of a manufacturing method of a semiconductor device in a conventional art.

In the above embodiments, in FIG. 17, a polysilicon film 3 is formed on a pad insulating film 2. However, in other modification or variation, the polysilicon film 3 may not be included. This applies also to the other embodiments to be described hereinbelow.

EMBODIMENT 2

A second embodiment of the invention will be described by using FIGS. 17–23 again. This embodiment relates to improvement of the conventional trench isolation process.

In the manufacturing method according to this embodiment including trench isolation, first, the conventional steps of FIGS. 17–20 are executed.

Figure 18:
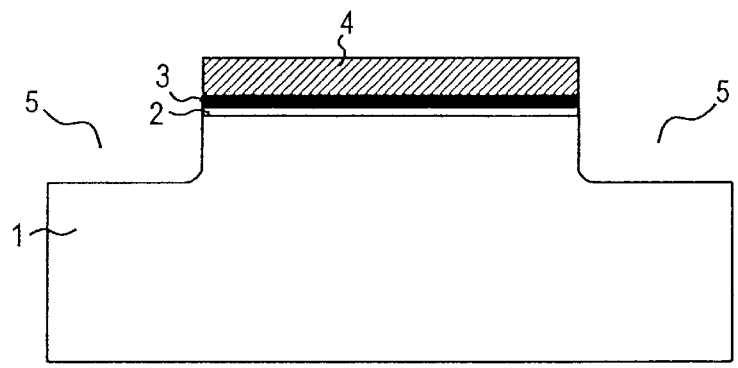

Among those steps, at the stage of FIG. 18, oxidation may be performed after the trench etching to eliminate etching damage of the silicon substrate 1. At the stage of FIG. 19 or ensuing stages, a heat treatment may be performed after burying the trench-filling CVD oxide film 6 to stabilize the wet etching rate etc. of the CVD oxide film 6.

Figure 2:
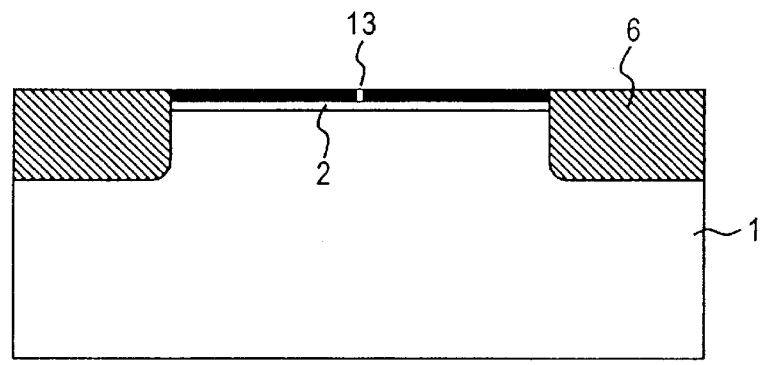
FIGS. 2 and 3 are cross sectional views of a semiconductor device to explain a second embodiment of the present invention.
Figure 3:
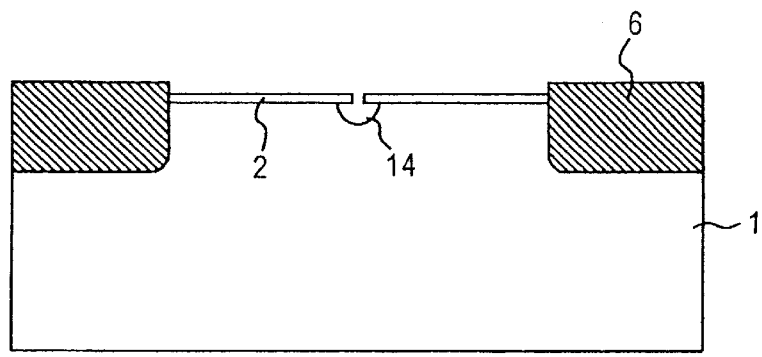

Depending on the heat treatment conditions (e.g., the heat treatment may be performed at a low-temperature of 1,000° C. or less), there may occur a case that stress occurring in the polysilicon film 3 causes a damage or split 13 in the polysilicon film 3 as shown in FIG. 2. In this case, if the polysilicon film 3 were removed by dry etching as in the conventional process in which the selective etching ratio of the polysilicon film 2 to the pad insulating film 2 is small, there is fear that as shown in FIG. 3 the silicon substrate 1 would be etched as indicated by reference numeral 14 in FIG. 3 at the portion where the polysilicon film 3 has the damage 13.

This phenomenon can be avoided in the process of the first embodiment in which the polysilicon film 3 is removed by wet etching. That is, by virtue of a large selective etching ratio of the polysilicon film 3 to the pad insulating film 2, the silicon substrate 1 is not etched even if the polysilicon film 3 has the damage or lost portion 13. However, if a hydrofluoric acid solution treatment is performed before the polysilicon etching to remove a native oxide film on the polysilicon film, there is fear that the pad insulating film 3 and hence the silicon substrate 1 may be etched irrespective of whether dry etching or wet etching is employed. This event should be avoided.

As described above, conventionally, the heat treatment of the trench oxide film 6 is performed at 1,000° C. or less. In contrast, in this embodiment, the heat treatment of the trench oxide film 6 is performed at 1,050° C. or more.

The heat treatment at 1,050° C. or more provides an advantage that stress-induced damages are less prone to occur in the polysilicon film 3, thereby the stress is hard to be entered into the polysilicon film 3.

Then, in the step of FIG. 20, the polysilicon film 3 is removed by wet etching as described in the first embodiment. The combination of the steps of performing the heat treatment of the trench oxide film 6 at 1,050° C. or more and then removing the polysilicon film 3 by wet etching further increases the margin.

The steps of FIG. 21 and the following steps may be the same as in the conventional process and hence the duplicated explanations are not described here.

As described above, according to this embodiment, the polysilicon film on the pad insulating film that is formed on the silicon substrate is wet-removed after the heat treatment at 1,050° C. or more. This makes it possible, for example, to increase the reliability of the gate oxide film.

EMBODIMENT 3

A third embodiment of the present invention will be described by using FIGS. 17–23 again. This embodiment relates to improvement of the conventional trench isolation process.

Figure 19:
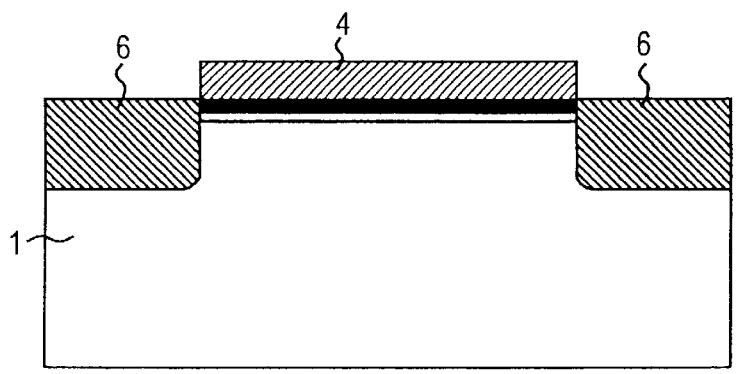
Figure 26:
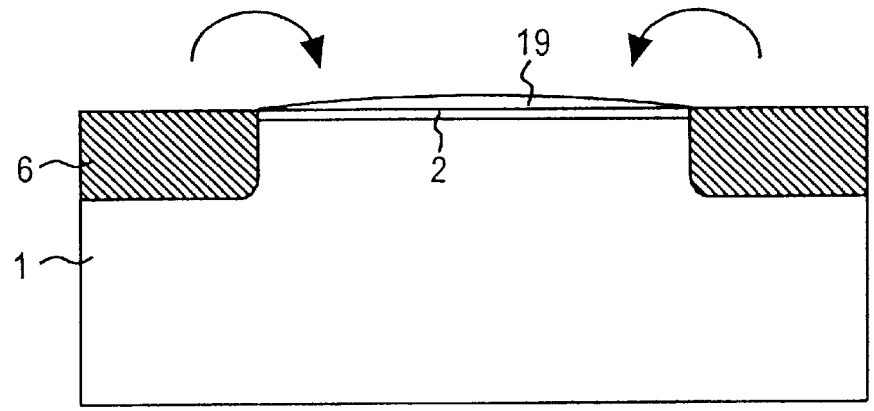

In the manufacturing method according to this embodiment including trench isolation, first, the conventional steps of FIGS. 17–20 are executed.

Where the trench-filling silicon oxide film 6 is formed by HDP-CVD, for example, in the step of FIG. 19 among the above steps, there is a problem that at the time of a heat treatment the thickness of the pad insulating film 2 is increased as denoted by reference numeral 19 in FIG. 26 because of degassing from the trench oxide film 6 (HDP-CVD film).

Figure 4:
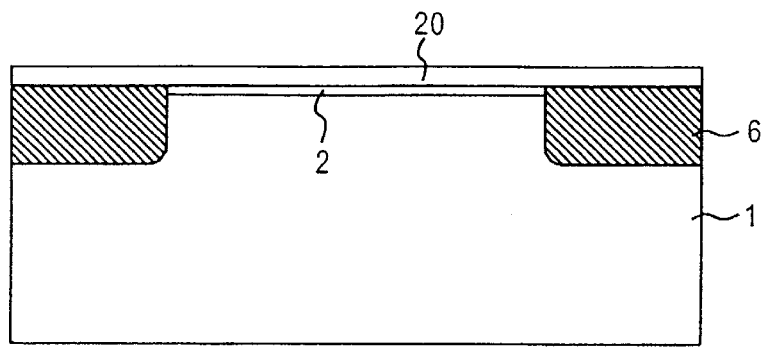
FIG. 4 is a cross sectional view of a semiconductor device to explain a third embodiment of the present invention.

In this embodiment, as a countermeasure against the degassing that occurs when the trench oxide film 6 (TEOS oxide film or HDP-CVD film) is annealed, a CVD oxide film 20 is deposited by using a silane-type or dichlorosilane-type gas as shown in FIG. 4. The oxide film 20 thus formed is different from the TEOS oxide film in the density, hygroscopicity, etc., degassing from the trench oxide film 6 can be suppressed. Therefore, there does not occur the event that the pad oxide film 2 is made thicker when the trench oxide film 6 is annealed.

Another effective countermeasure against the degassing at the time of the annealing of the trench oxide film 6 is to modify the surface layer of the trench oxide film 6 (TEOS oxide film) by a heat treatment in an oxidizing atmosphere and then anneal the trench oxide film 6.

A still another effective countermeasure against the degassing is to perform a short-time, rapid heat treatment, for example, RTA (rapid thermal annealing) as performed in a single-wafer heat treatment apparatus, on the trench oxide film 6 and then anneal the trench oxide film 6 by using a tube-type heat treatment apparatus, for example.

As described above, according to this embodiment, the cover film is deposited before the annealing of the trench oxide film (TEOS oxide film), the heat treatment is performed after the trench oxide film is subjected to oxidation, or the trench oxide film is processed by a tube-type heat treatment apparatus after being subjected to RTA with a single-wafer heat treatment apparatus. This makes it possible to suppress the degassing from the TEOS film.

EMBODIMENT 4

A fourth embodiment of the present invention will be described by using FIGS. 17–23 again. This embodiment relates to improvement of the conventional trench isolation process.

In the manufacturing method according to this embodiment including trench isolation, first, the conventional steps of FIGS. 17–21 are executed.

Where the heat treatment of the trench oxide film 6, for example, is performed in a nitriding atmosphere in the steps up to the state of FIG. 21, there may occur an event that the silicon substrate 1 is nitrided through the pad insulating film 2. This phenomenon is more prone to occur in a state that the pad insulating film 2 has thin portions in the vicinity of the isolation oxide film 6 as shown in part B in FIG. 27. The later-formed gate oxide film 7 has a small thickness above nirided portions of the silicon substrate 1. Therefore, the gate breakdown voltage may be reduced, possibly lowering the reliability of the gate insulating film 7.

Figure 27:
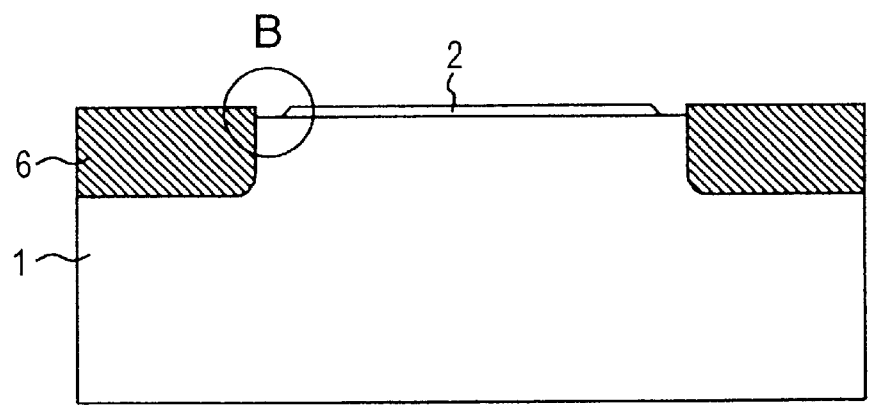

When the surface of the silicon substrate 1 has been nitrided in regions in the vicinity of the isolation oxide film 6 where the thickness of the pad insulating film 2 is decreased as shown in FIG. 27, in this embodiment the pad insulating film 2 is removed by using a hydrofluoric acid solution in the step of FIG. 21 and then the nitride layers are removed by processing the surface with a phosphoric acid type solution to expose the surface of the silicon substrate 1 as shown in FIG. 22.

Figure 23:
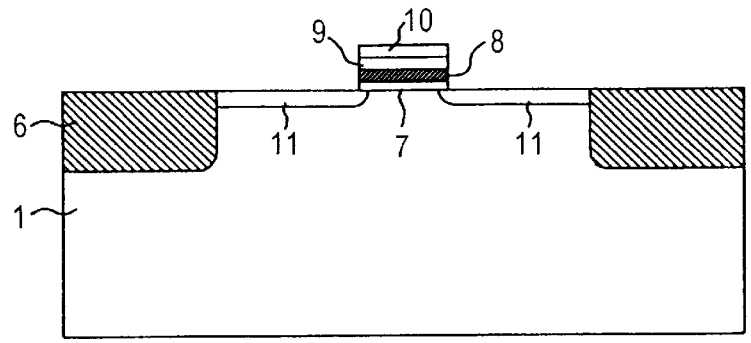

Then, the MOS transistor is formed as shown in FIG. 23. The removal of nitride layers increases the reliability of the gate insulating film 7.

As described above, according to this embodiment, before formation of the gate insulating film, the silicon substrate is wet-etched with a phosphoric acid type solution to remove nitrided layers. This makes it possible to increase the reliability of the gate oxide film.

EMBODIMENT 5

A fifth embodiment of the present invention will be described by using FIGS. 17–23 again. This embodiment relates to improvement of the conventional trench isolation process.

In the manufacturing method according to this embodiment including trench isolation, first, the conventional steps of FIGS. 17–21 are executed.

In the fourth embodiment described above, the silicon substrate 1 is processed with a phosphoric acid type solution upon its exposure. However, there is fear that the silicon substrate 1 may be roughened by the phosphoric acid treatment in non-nitrided regions (i.e., the margin for the roughening is small). The roughening of the silicon substrate 1 may lower the reliability of the gate oxide film 7.

Figure 5:
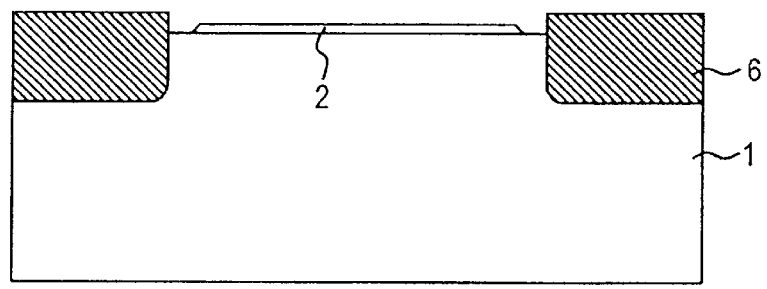
FIG. 5 is a cross sectional view of a semiconductor device to explain a fifth embodiment of the present invention.

In view of the above, in this embodiment, after only the thinned portions (see FIG. 27) of the pad insulating film 2 are removed as shown in FIG. 5 in the step of FIG. 21, nitride layers are removed by a phosphoric acid treatment and then the remaining portion of the pad insulating film 2 is removed to expose the surface of the silicon substrate 1 as shown in FIG. 22. According to this method, since non-nitrided portions of the silicon substrate 1 are not exposed to phosphoric acid, the margin for the roughening is increased and hence the reliability of the gate insulating film 7 is increased.

As described above, according to this embodiment, before formation of the gate insulating film, only the portions of the silicon substrate under thinned portions of the pad oxide film are exposed, nitride layers are removed by wet processing, and then the remaining portion of the pad oxide film is etched. This makes it possible to increase the reliability of the gate oxide film.

EMBODIMENT 6

A sixth embodiment of the present invention will be described by using FIGS. 17–23 again. This embodiment relates to improvement of the conventional trench isolation process.

In the manufacturing method according to this embodiment including trench isolation, first, the conventional steps of FIGS. 17–21 are executed.

Figure 6:
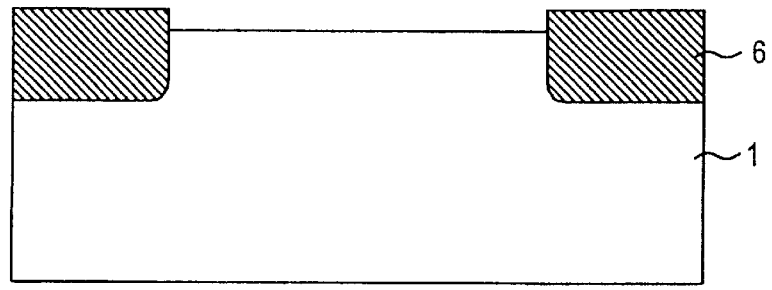
FIGS. 6 to 9 are cross sectional views of a semiconductor device to explain a sixth embodiment of the present invention.
Figure 7:
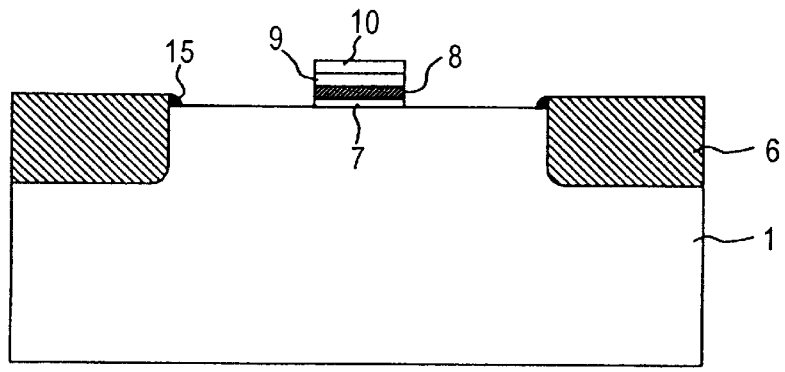

In the step of FIG. 21, a level difference may occur between the surfaces of the trench isolation film 6 and the silicon substrate 1 as shown in FIG. 6. In this case, there may occur a problem that residues 15 of the doped polysilicon film 8 remain at the edge of the trench isolation film 6 as shown in FIG. 7 when the gate electrode pattern is formed.

Figure 8:
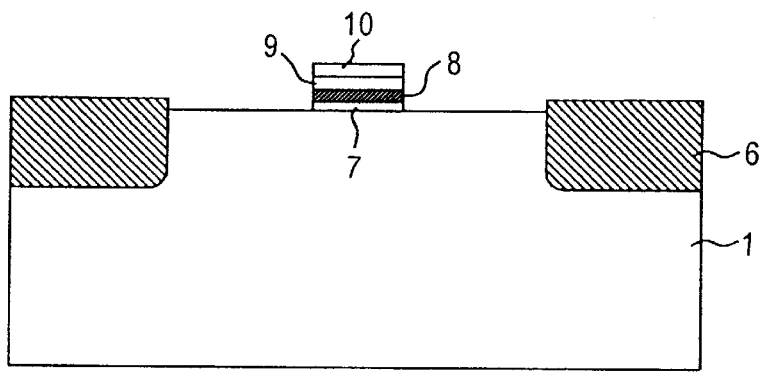

In view of the above, in this embodiment, polysilicon isotropic wet etching is performed after the gate electrode is formed by anisotropic etching, whereby the polysilicon residues 15 at the edge of the trench isolation film 6 are removed as shown in FIG. 8. At this time, it is necessary to prevent the underlying silicon substrate 1 from being exposed as a result of etching of the gate insulating film 7 during the etching of the gate electrode.

Figure 9:
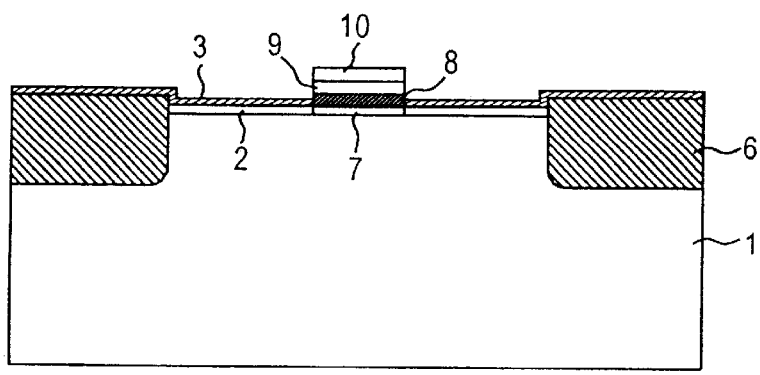

Alternatively, etching residues at the edge (i.e., the step) of the trench isolation film 6 can be prevented by performing polysilicon wet etching after performing anisotropic etching halfway on the doped polysilicon film 8 of the gate electrode as shown in FIG. 9. That is, the isotropic wet etching on the remaining gate electrode is performed after the anisotropic etching on the gate electrode is stopped halfway.

Since the subsequent steps may be the same as in the conventional process, they are not described in detail here.

As described above, according to this embodiment, isotropic wet etching is performed after anisotropic etching is performed on the gate electrode. Alternatively, isotropic wet etching is performed on the remaining gate electrode after anisotropic etching on the gate electrode is stopped halfway. This makes it possible to decrease polysilicon etching residue.

EMBODIMENT 7

A seventh embodiment of the present invention will be described by using FIGS. 17–23 again. This embodiment relates to improvement of the conventional trench isolation process.

In the manufacturing method according to this embodiment including trench isolation, first, the conventional steps of FIGS. 17–21 are executed.

Figure 28:
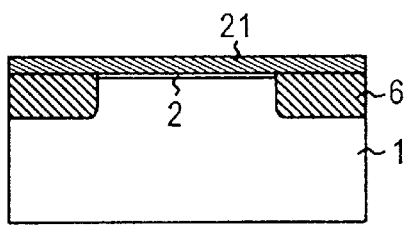
FIGS. 28 through 31 are cross sectional views for explaining another process of a manufacturing method of a semiconductor device in a conventional art.
Figure 28:
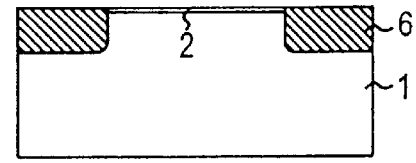
Figure 29:
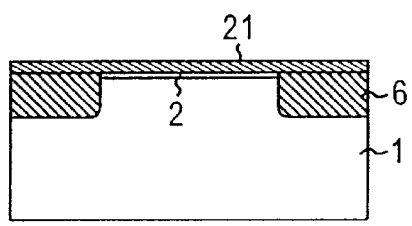
Figure 29:
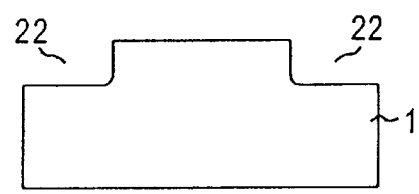
Figure 31:
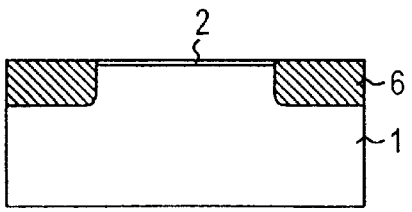
Figure 31:
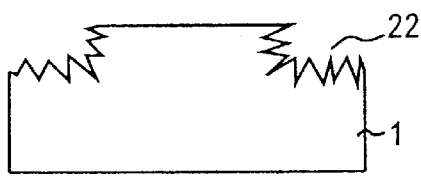

If the level difference of the trench isolation structure is small in the step of FIG. 21, there may occur a problem that alignment marks cannot be detected in ensuing steps. To solve this problem, conventionally, after formation of the trench isolation structure, the portions other than mark portions are covered with a resist 21 (see FIG. 28) and then the silicon oxide film 6 that is buried in the trench portion 22 is removed only in the mark portions to form steps (see FIG. 29). Then, an impurity for well formation or control of the threshold voltage of the transistor is implanted (see FIG. 30). However, there is a problem that the portions where the silicon substrate 1 is exposed, in particular, the trench portions, are roughened in a heat treatment for activating the impurity (see FIG. 31). The roughening may lower the alignment accuracy.

In contrast, in this embodiment, as a countermeasure against the roughening of the substrate 1 in the trench isolation mark portions, steps shown in FIGS. 10–13 are performed. In each of FIGS. 10–13, the left-hand part shows a device portion (or a device forming portion) and the right-hand part shows a mark portion.

Figure 10:
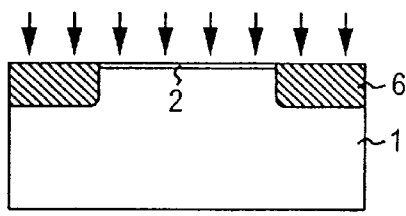
FIGS. 10 to 13 are cross sectional views of a semiconductor device to explain a seventh embodiment of the present invention.

First, as shown in FIG. 10, ion implantation for threshold voltage control or well formation is performed on the area including the mark portions. Since the surface of the silicon substrate 1 is covered with the insulating film 2, the silicon substrate 1 is not roughened even when a heat treatment for activation is performed. Therefore, the alignment accuracy is improved.

Figure 11:
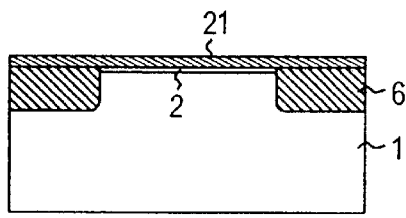

Then, the device portion is covered with a resist 21 as shown in FIG. 11.

Figure 12:
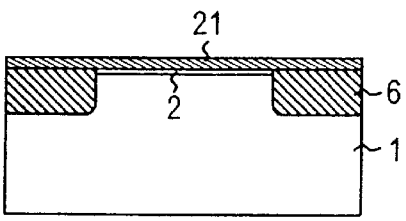

Then, as shown in FIG. 12, the trench insulating film 6 is removed in the mark portions to form steps.

Figure 13:
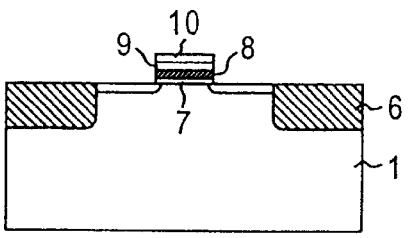
Figure 13:
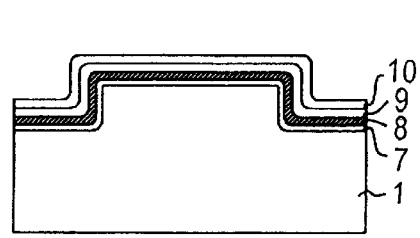

Then, as shown in FIG. 13, a gate insulating film 7, a doped polysilicon film 8, a metal silicide film 9, and an insulating film 10, and source and drain regions are formed as a transistor.

Although the above process is directed to the case of using the trench isolation, the method of this embodiment is also effective for the LOCOS isolation method in a case where an isolation oxide film is removed in mark portions.

As described above, according to this embodiment, in both of the device portion and the mark portions, an impurity is implanted through the pad insulating film and then annealing is performed. This makes it possible to improve the alignment accuracy.

EMBODIMENT 8

An eighth embodiment of the present invention will be described with reference to FIGS. 14–16. In this embodiment, wet etching of a silicon insulating film is applied to formation of a roughened-surface capacitor of a storage node.

Figure 14:
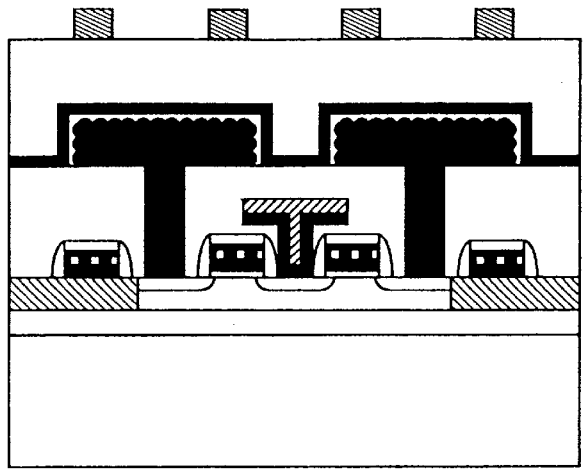
FIGS. 14 to 16 are cross sectional views of a semiconductor device to explain a eighth embodiment of the present invention.
Figure 15:
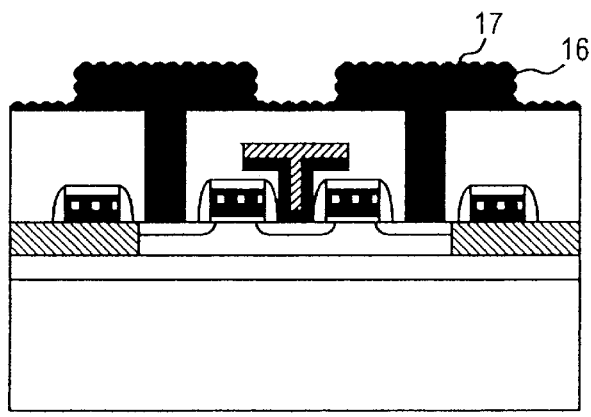

FIG. 14 is a sectional view showing the structure of a DRAM formed by applying a surface-roughening process to a capacitor. A description will be made of a case where polysilicon wet etching is applied to this structure.

A roughened-surface capacitor is formed in the following manner. After a storage node 16 is formed as shown in FIG. 15, silicon particles 17 are formed on the entire wafer surface. Then, as shown in FIG. 16, the silicon particles 17 on an interlayer insulating film 18 are removed.

If the silicon particles 17 are removed by using a wet etching liquid, particularly aqueous ammonia, the graininess of the roughened surface becomes high because the etching rate is such directivity as to be high in the direction perpendicular to the surface. This provides an advantage that the capacitance is increased.

Even where the silicon particles 17 on the interlayer insulating film 18 are removed by dry etching, it is effective to also perform wet etching to remove silicon particle residues on the interlayer insulating film 18.

Figure 16:
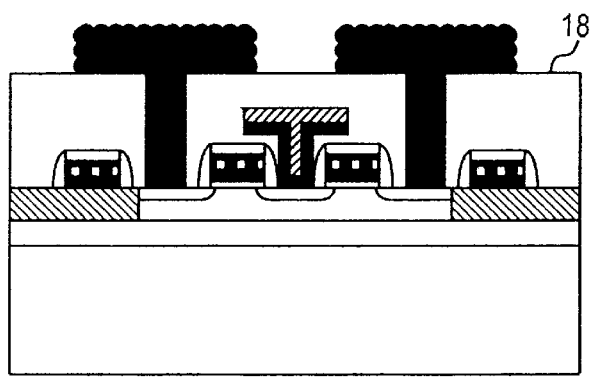

Further, there may occur a case that silicon particles are slightly formed on an interlayer insulating film 18 also when a structure shown in FIG. 16 is formed by selectively roughening the surface of a storage node 16. In this case, silicon wet etching may be performed to remove those silicon particles and increase the graininess of the roughened surface.

As described above, according to this embodiment, the silicon interlayer insulating film is wet-etched after roughening of the storage node. This makes it possible to increase the capacitance and remove polysilicon residues from the roughened surface more reliably.

The embodiments of the invention have been described above. It is noted that these embodiments can be practiced in combination when necessary or with proper selection from among them.

Having the above features, the manufacturing methods of a semiconductor device according to the present invention provides the following advantages.

A polysilicon film on a pad insulating film that is formed on a substrate is wet-removed after formation of a trench isolation structure. This makes it possible to, for example, increase the reliability of a gate oxide film and reduce the junction leak current.

A cover film is deposited before annealing of a trench oxide film (TEOS oxide film), a heat treatment is performed after a trench oxide film is subjected to oxidation, or a trench oxide film is processed by a tube-type heat treatment apparatus after being subjected to RTA with a single-wafer heat treatment apparatus. This makes it possible to suppress degassing from the TEOS film, thereby, for example, increasing the reliability of a gate oxide film.

Before formation of a gate insulating film, nitride layers are removed by wet processing, that is, by wet-etching a silicon substrate with a phosphoric acid solution. This makes it possible to increase the reliability of the gate oxide film.

Before formation of a gate insulating film, only the portions of a silicon substrate under thinned portions of a pad oxide film are exposed, nitride layers are removed by wet processing, and then the remaining pad oxide film is etched. This makes it possible to increase the reliability of the gate oxide film.

Isotropic wet etching is performed after anisotropic etching is performed on the gate electrode. Alternatively, isotropic wet etching is performed on the remaining gate electrode after anisotropic etching on a gate electrode is stopped halfway. This makes it possible to decrease polysilicon etching residue.

In both of a device portion and mark portions in a chip or wafer, an impurity is implanted through a pad insulating film and then annealing is performed. This makes it possible to improve the alignment accuracy.

A silicon interlayer insulating film is wet-etched after roughening of the surface of a storage node. This makes it possible to increase the capacitance and remove polysilicon residues from a roughened surface more reliably.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-148864, filed on May 27, 1999 including specification, claims, drawings and summary, on which the Convention priority of the present application is based, are incorporated herein by reference in its entirety.

What is claimed is:

1. A method of manufacturing a semiconductor device, comprising the steps of:

forming a pad insulating film, a polysilicon film, and a silicon nitride film sequentially on a semiconductor substrate;

forming a trench portion for isolating device forming regions on said semiconductor substrate by selectively etching said silicon nitride film, polysilicon film, pad insulating film, and semiconductor substrate;

embedding a silicon oxide film in said trench portion for isolating said device forming regions;

removing said silicon nitride film, polysilicon film, and pad insulating film to expose a surface of said semiconductor substrate; and forming a circuit element on the exposed surface of said semiconductor substrate; wherein said polysilicon film is removed by isotropic wet etching.

2. The method of manufacturing a semiconductor device according to claim 1, wherein a heat treatment to said silicon oxide film embedded in said trench portion is performed at a temperature of 1,050° C.

3. The method of manufacturing a semiconductor device according to claim 1, wherein said wet etching is performed by aqueous ammonia or a mixed solution of aqueous ammonia and a hydrogen peroxide solution.

4. The method of manufacturing a semiconductor device according to claim 1, wherein a CVD oxide film is formed on said silicon oxide film embedded in said trench portion, following the step of removing said silicon nitride film and polysilicon film.

5. The method of manufacturing a semiconductor device according to claim 1, wherein said silicon oxide film embedded in said trench portion is oxidized, following the step of removing said silicon nitride film and polysilicon film.

6. The method of manufacturing a semiconductor device according to claim 1, wherein a short-time, rapid heat treatment is performed on said silicon oxide film embedded in said trench portion, following the step of removing said silicon nitride film and polysilicon film.

7. The method of manufacturing a semiconductor device according to claim 1, wherein said pad insulating film is removed by use of a hydrofluoric acid solution followed by a treatment with a phosphoric acid type solution, to expose a surface of said semiconductor substrate.

8. The method of manufacturing a semiconductor device according to claim 1, wherein the step of removing said pad insulating film includes the sub steps of:

removing only thin portions of said pad insulating film to partially expose a surface of said semiconductor substrate;

performing a wet treatment to remove a nitride layer from said surface of said semiconductor substrate; and then removing remaining portions of said pad insulating film to expose a surface of said semiconductor substrate.

9. The method of manufacturing a semiconductor device according to claim 1, wherein ion implantation into said semiconductor substrate is performed after removing said silicon nitride film and polysilicon film, and prior to removing said pad insulating film.

10. The method of manufacturing a semiconductor device according to claim 1, wherein said step of forming a circuit element on the exposed surface of said semiconductor substrate includes the sub-steps of:

forming at least a gate insulating film, a polysilicon film, and an upper insulating film sequentially on said exposed surface of said semiconductor substrate;

forming a gate electrode by patterning said upper insulating film, polysilicon film, and gate insulating film by anisotropic etching; and performing isotropic wet etching to remove polysilicon on said surface of said semiconductor substrate.

* * * * *